United States Patent
Ki

(10) Patent No.: US 7,129,024 B2
(45) Date of Patent: Oct. 31, 2006

(54) ELECTRON BEAM LITHOGRAPHY METHOD

(75) Inventor: Won-Tai Ki, Kyungki-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 532 days.

(21) Appl. No.: 10/623,612

(22) Filed: Jul. 22, 2003

(65) Prior Publication Data

US 2004/0058536 A1  Mar. 25, 2004

(30) Foreign Application Priority Data

Aug. 9, 2002  (KR) ...................... 10-2002-0047230

(51) Int. Cl.
*G03C 5/00* (2006.01)

(52) U.S. Cl. ........................ 430/296; 430/22; 430/942

(58) Field of Classification Search .................. 430/22, 430/296, 942
See application file for complete search history.

(56) References Cited

U.S. PATENT DOCUMENTS

| 5,894,057 A | * | 4/1999 | Yamaguchi et al. | ........... 430/30 |
| 6,162,581 A | * | 12/2000 | Nakasuji et al. | ............. 430/296 |
| 6,258,511 B1 | * | 7/2001 | Okino | ......................... 430/296 |

* cited by examiner

*Primary Examiner*—Christopher G. Young
(74) *Attorney, Agent, or Firm*—Volentine Francos & Whitt, PLLC

(57) ABSTRACT

An electron beam lithography method includes extending the widths of a plurality of stripes which divide a region where an electron beam exposure is to be performed, so that the boundaries of the stripes overlap adjacent stripes at each boundary, and sequentially exposing each of the stripes to an electron beam.

13 Claims, 4 Drawing Sheets

ELECTRON BEAM LITHOGRAPHY METHOD

BACKGROUND OF THE INVENTION

1. Field of the Invention

The present invention relates to manufacturing a semiconductor device, and more particularly, to a method of electron beam lithography for minimizing throughput loss and preventing butting errors from occurring.

A claim of priority is made to Korean Patent Application No. 2002-0047230, filed Aug. 9, 2002, the contents of which are incorporated herein by reference.

2. Description of the Related Art

Among semiconductor fabricating processes, a lithography process using an electron beam is used to transfer a delicate pattern. Until now, lithography using a electron beam has generally been used for fabricating a photo mask in which printing a delicate pattern is regarded as a very important factor.

When a mask is fabricated using the electron beam, the size of the electron beam is limited to a very small region, and so it is difficult to expose the whole mask. Therefore, electron beam lithography equipment will divide the region to be exposed to light into several segments, divide each of the segments into several stripes or frames, and then expose sequentially each of the stripes to the electron beam.

Since an optical system for the electron beam employed in the electron beam lithography equipment is limited in comparison to a typical optical system, it is necessary to divide the region to be exposed into several segments and to divide each of the segments into several stripes, in order to expose each of the stripes to the electron beam. In electron beam lithography, a chip region to be exposed is divided into regions having a certain length.

Electron beam lithography equipment, such as equipment of the MEBES family of ETEC, Inc. (located in the U.S.A), typically is configured to expose stripes of about 1 mm in width each. Electron beam lithography equipment of Toshiba, Inc. (located in Japan) is configured to expose frames. However, this equipment is similar in that they divide the region to be exposed into certain small units such as stripes or frames.

When the stripes or frames are sequentially exposed to the electron beam, a so-called butting error, i.e. wrenching between adjacent stripes, occurs. The butting error represents an error in which a pattern ranging over an interval between the stripes, which is transferred by the exposure, is wrenched or dropped from the stripe boundary. Because of the butting error, a critical dimension error in which the critical dimension of the pattern in the stripe boundary changes, or a position error in which a pattern position is wrenched may occur.

The butting error is sometimes called a stitching error in a method for scanning the electron beam, e.g., a vector scan or a raster scan. However, most butting errors are due to wrenching of the stripes when the stripes are scanned by the electron beam. In order to overcome such butting errors, a multi-pass printing method has been developed.

FIG. 1 a schematic diagram of a method for sequentially exposing the electron beam to each of the stripes. FIG. 2 is a schematic diagram of a typical multi-pass printing method.

Referring to FIG. 1, a region to be exposed is divided into several segments and each of the segments into N stripes, and then each of the stripes are sequentially exposed. For example, a first stripe is exposed, and then other stripes are sequentially exposed. When the exposure of an $N^{th}$ stripe has been completed, the exposure of an entire segment is completed.

However, the multi-pass printing method includes performing several exposure passes, as shown in FIG. 2, so as to prevent butting errors which may be caused when exposure is sequentially performed for each of the stripes. Performing several exposure passes includes setting an offset from the first stripe position, or in other words moving a stripe. For example, the process involves moving a stripe of a second exposure pass by a half or a quarter of the width of a stripe used in a first exposure pass, performing the second exposure pass, and repeating the above steps. Here, when two exposure passes constitute the whole exposure process, the amount of each exposure pass may be half of a target dose.

As a result, exposure inferiority at a boundary between stripes, which results during the first exposure pass, may be compensated for to a certain degree during the second exposure pass (or a third or a fourth exposure pass). As a result, butting errors can be effectively prevented. In practice, butting errors decrease in proportion to the number of the exposure passes.

However, when electron beam lithography is performed using the multi-pass printing method, the time between exposure passes increases in proportion to the number of exposure passes. Accordingly, the time necessary for electron beam lithography increases, a fact which ultimately causes a throughput loss.

SUMMARY OF THE INVENTION

The present invention provides an electron beam lithography method which minimizes the time necessary for performing exposure passes while preventing butting errors.

According to an aspect of the present invention, there is provided an electron beam lithography method. The electron beam lithography method may be applied to the manufacturing of a mask.

The electron beam lithography method includes extending the widths of a plurality of stripes which divide a region where an electron beam exposure is performed so that the stripes overlap adjacent stripes at the boundaries between stripes, and sequentially performing electron beam exposure for each of the stripes. Here, a dose amount of the electron beam in the extended region of a stripe is less than the scan dose of the electron beam for a stripe region. The scan dose of the electron beam for the extended region of a stripe is half of the scan dose of the electron beam for a stripe region. The scan dose of the electron beam for an extended region of a stripe is reduced in a stepwise manner toward an adjacent stripe.

According to another aspect of the present invention, the electron beam lithography method includes extending the widths of a plurality of stripes which divide a region where an electron beam exposure is performed so that the stripes overlap adjacent stripes at the boundaries between stripes, and moving the overlap region of the stripes and sequentially performing the electron beam exposure on each of the stripes at least two times.

According to still another aspect of the present invention, the electron beam lithography method includes extending the widths of a plurality of stripes which divide a region where an electron beam exposure is performed so that the stripes overlap adjacent stripes at the boundaries between each of the stripes, sequentially performing a first electron beam exposure for each of the stripes, moving the overlap region of the stripes by moving the stripes, and sequentially performing a second electron beam exposure for each of the stripes. Here, the first and the second electron beam exposures are performed at half a target dose.

According to the present invention, it is possible to minimize butting errors occurring at a boundary between stripes, so as to minimize the time necessary for exposure passes. Further, the time necessary for electron beam lithography procedures used for mask fabrication can be effectively reduced, and thus an increase in yield can be achieved.

BRIEF DESCRIPTION OF THE DRAWINGS

The above and other aspects and advantages of the present invention will become readily apparent from the detailed description that follows, with reference to the accompanying drawings, in which.

DETAILED DESCRIPTION OF THE INVENTION

Figure 1:
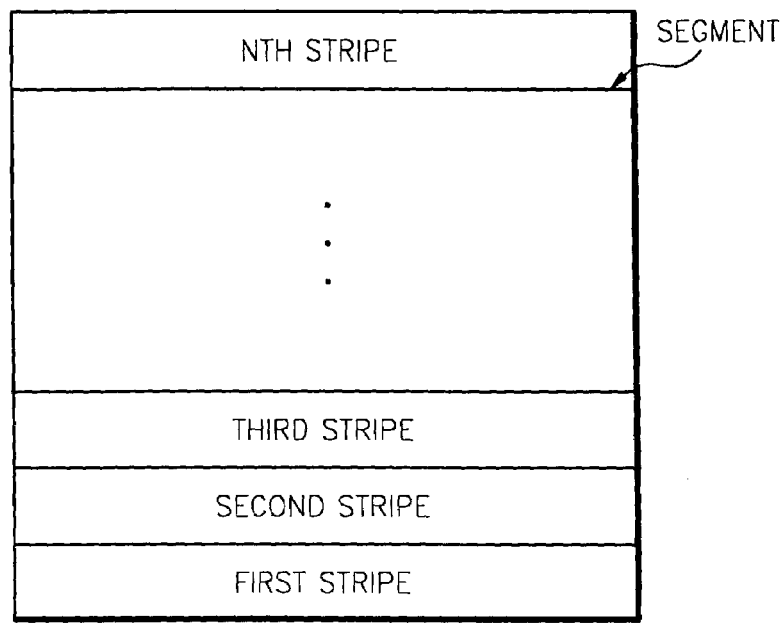
FIG. 1 is a schematic diagram of a conventional method for sequentially performing electron beam exposure on each of the stripes.
Figure 2:
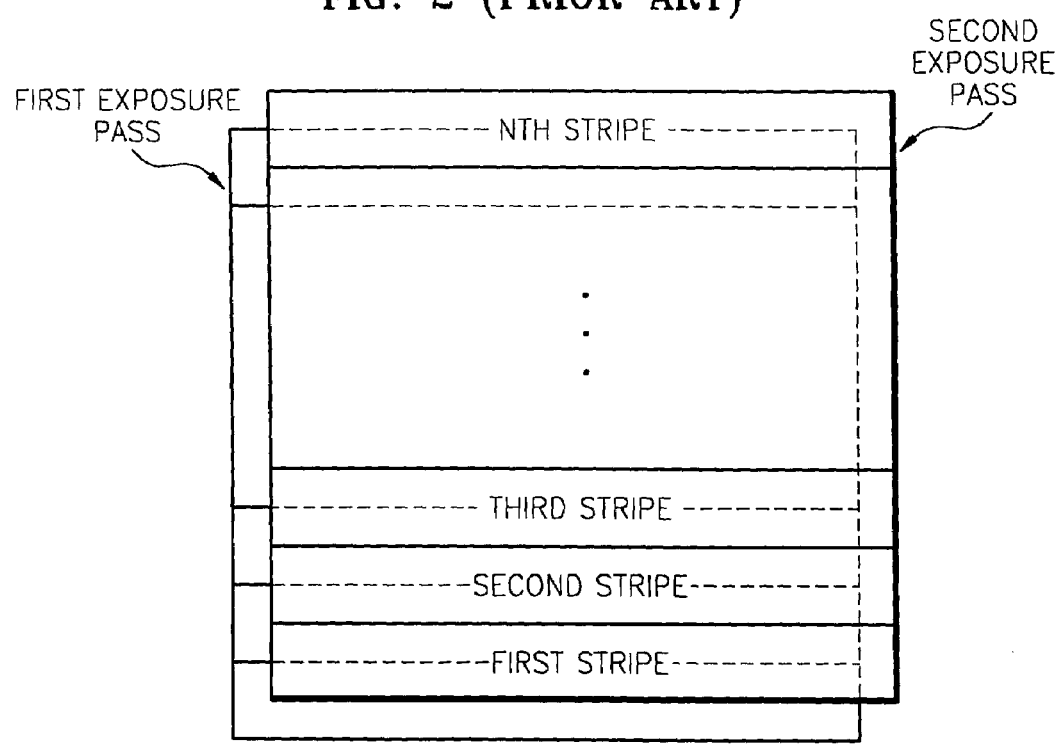
FIG. 2 is a schematic diagram of a conventional method of performing electron beam exposure using multi-pass printing.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete and will fully convey the concept of the invention to those skilled in the art. In the drawings, the shapes of elements are exaggerated for clarity, and like reference numerals are used to refer to like elements throughout the application.

In preferred embodiments of the present invention, electron beam exposure is performed by setting boundaries of stripes to overlap with boundaries of adjacent stripes. Such stripes tend to be wider than a conventional stripe shown in FIG. 1.

Figure 3:
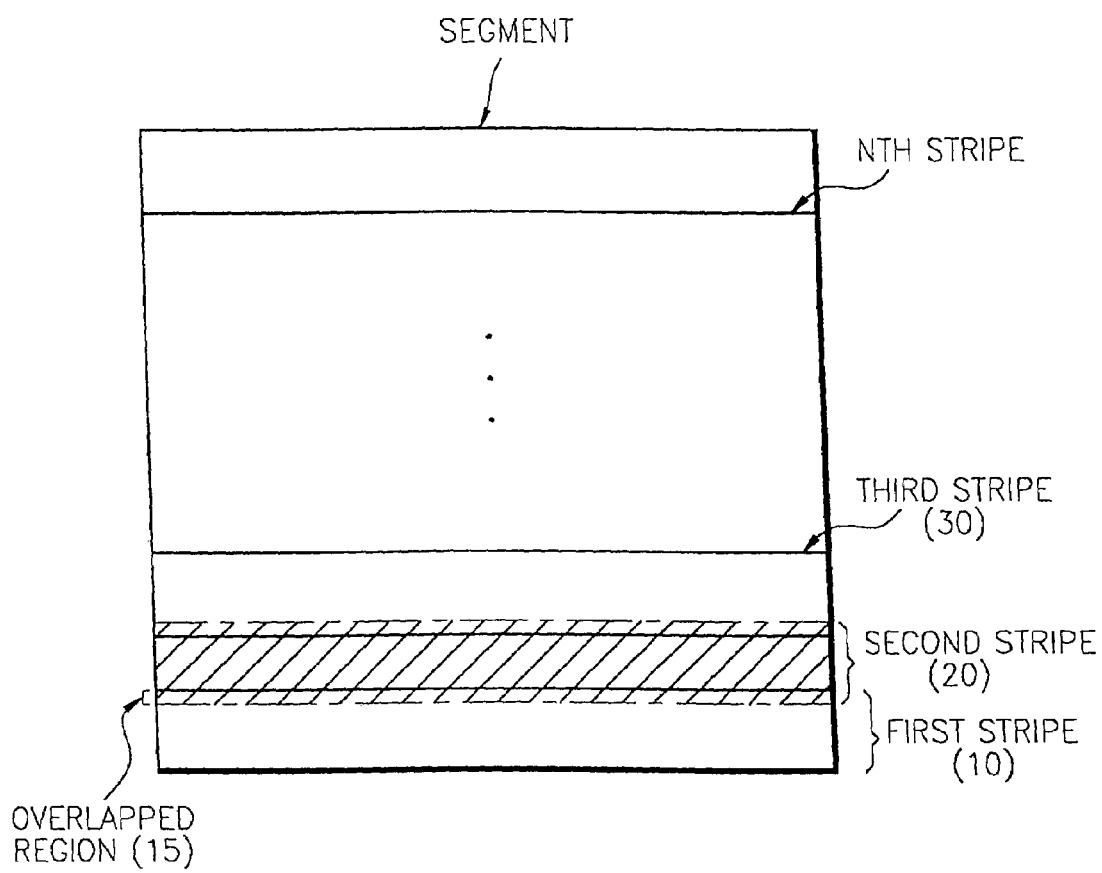
FIG. 3 is a schematic diagram for explaining a method of performing electron beam lithography according to a first embodiment of the present invention.
Figure 4:
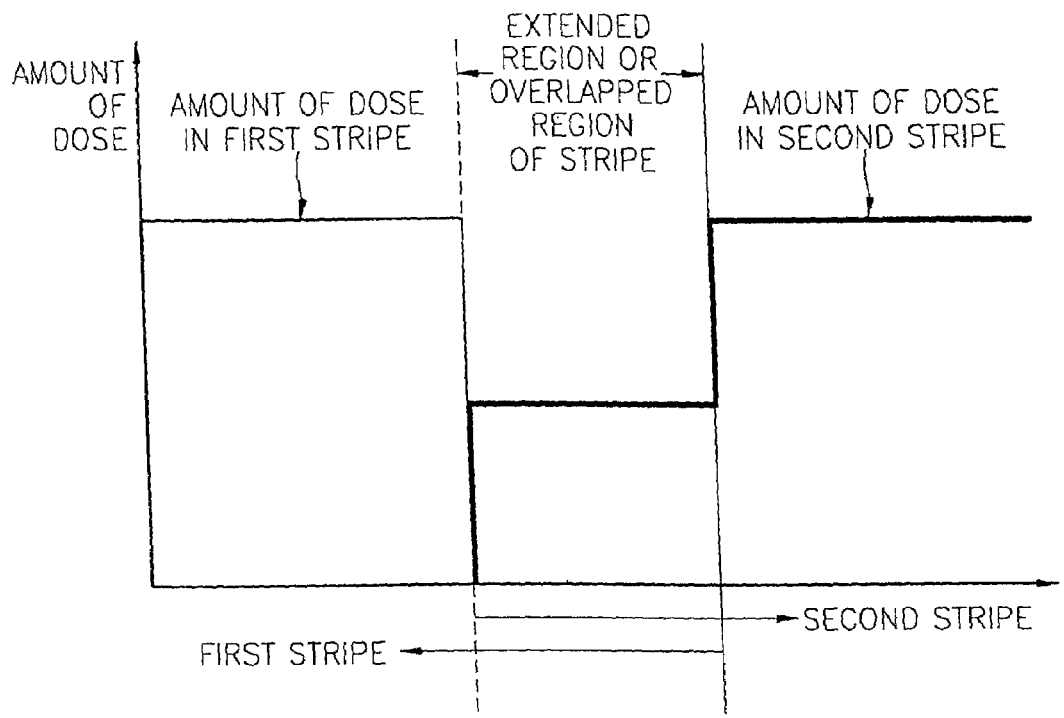
FIGS. 4 and 5 are dose profiles for explaining a method of performing electron beam lithography according to a first embodiment of the present invention.
Figure 5:
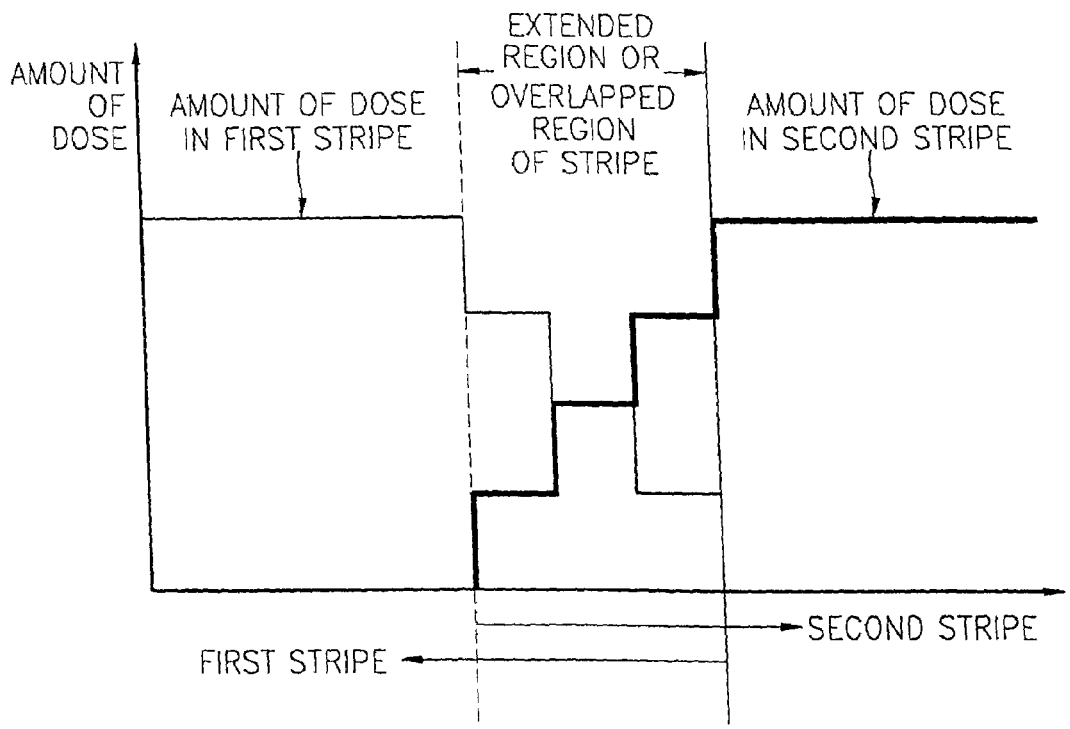

FIG. 3 is a schematic diagram for explaining a method of performing electron beam lithography according to a first embodiment of the present invention. FIGS. 4 and 5 are dose profiles for explaining a method of performing electron beam lithography according to a first embodiment of the present invention.

FIG. 3 roughly shows stripes set according to the first embodiment of the present invention. A region to be exposed, e.g., a mask region, is divided into several segments and each of the segments are divided into a plurality of stripes. Here, stripes may be embodied as frames depending on the circumstances.

The stripes formed by dividing the segments are wide enough to overlap adjacent stripes. For example, as shown in FIG. 3, a first stripe 10 is set to overlap a second stripe 20. At the boundary between the first stripe 10 and the second stripe 20, an overlap region 15 is formed where the stripes 10 and 12 overlap. The second stripe 20 is wide enough to also overlap a third stripe 30.

As shown in FIG. 1, a conventional stripe is set not to overlap other stripes, but is set to have a boundary matching the boundaries of adjacent stripes. In contrast, in the first embodiment of the present invention, the stripes are wide enough to have overlap regions 15 therebetween, as shown in FIG. 3.

For example, as shown in FIG. 1, if the width of each of the stripes constituting a segment is about 1 mm, the widths of the first, second, and third stripes 10, 20, and 30 of FIG. 3 are extended so that an upper boundary and a lower boundary of each of the stripes are extended by 50 μm, resulting in overlap regions 15 having a width of 100 μm. However, it should be understood that setting the width of the stripes 10, 20 and 30 of FIG. 3 by extending the upper boundary and the lower boundary of the stripes by the above noted amount is merely an example. That is, the width can be appropriately set according to each specific case, because the degree of wrenching between the stripes can be different for each case and the extended region is desired to be wider than the extent of the wrenching of the stripes. Therefore, the overlap region 15 of FIG. 3 can be set to have the same width as the extended region. However, the width of the overlap region 15 can be varied according to the degree of wrenching between the stripes.

In accordance with this first embodiment, butting errors are effectively reduced by performing electron beam exposure using overlap or extended regions 15 at boundaries between stripes. More specifically, an electron beam exposure is performed on the first stripe 10 of FIG. 3. Here, the electron beam is scanned over the region of the first stripe 10 with a scan nearly the same amount as a target dose. However, in the extended region of the first stripe 10 at overlap region 15 of the first stripe 10, it is desirable that the scan dose of the electron beam is less than the target dose.

FIG. 4 shows changes in the scan dose for the electron beam exposure according to the first embodiment of the present invention. Referring to FIG. 4, the scan dose of the first stripe 10 of FIG. 3 is equal to the amount of the target dose. However, in the extended stripe region of the first stripe 10 that overlaps the second stripe 20 at region 15, the scan dose is half the scan dose of the first stripe 10. Therefore, when the first stripe 10 is scanned by the electron beam, the scan dose is reduced in the extended stripe region as shown in FIG. 4.

Similarly, when the second stripe 20 of FIG. 3 is subsequently scanned with the electron beam after the first stripe 10 is scanned, a scan dose less than the target dose is applied to the extended region of the second stripe 20 that overlaps the first stripe 10 at the overlap region 15, and the target dose is applied to regions excluding the extended region. That is, a scan dose half the scan dose of the first and second stripes 10 and 20 is used for the extended region of the second stripe 20, as shown by the bold curve in FIG. 4.

If the scan by the electron beam or the exposure in the extended stripe region at the overlap region 15 is performed using a scan dose half the amount of the target dose, the error rate of the scan dose at the boundaries between the stripes can be reduced by 0.5–1.5, resulting in an improved error rate as compared with the conventional rate of 0–2.0. That is, a decrease of about 50% in scan dose error rate can be expected according to the first embodiment of the present invention.

The method of scanning by electron beam may be varied according to the type of equipment used for the electron beam exposure. However, the electron beam is typically scanned whereby a pixel which divides the stripes, or an address unit therebetween, is sequentially filled with the electron beam. Therefore, information data for the pixel or the address unit related to the extended region at the overlap region 15 is previously set as input to a controller of the electron beam exposure equipment, to thereby vary the scan dose.

The idea of varying electron beam exposure scan dose of a stripe in an exposure region was previously impossible. However, such variation of electron beam exposure scan dose is now possible using recently developed electron beam lithography equipment which is capable of correcting back scattering effects. For example, equipment such as the 50 KeV EMB series by Toshiba, Inc. or the eXara version of MEBES equipment performs the additional function of correcting back scattering effects, and thus can be used to diversify or vary electron beam exposure scan dose.

For example, in the extended region of the stripe according to the first embodiment of the invention, the electron beam can be exposed with a scan dose half the target dose. However, the extended region of the stripe can also be exposed with a scan dose that changes in a stepwise manner.

FIG. 5 shows a variation of the first embodiment of the invention, wherein scan dose exposure in the extended region of the stripe by the electron beam is changed in a stepwise manner. Referring to FIG. 5, the scan dose of the electron beam in the extended region of the first stripe that overlaps the second stripe at the overlap region is set to be reduced in a stepwise manner. Similarly, the scan dose of the electron beam in the extended region of the second stripe that overlaps the first stripe at the overlap region also is set to be reduced in a corresponding stepwise manner. Since the scan dose is set to be reduced in such a stepwise manner, the scan dose error rate in the overlap region 15 of FIG. 3 can be improved effectively.

In the electron beam lithography method according to the first embodiment of the present invention, the overlap region 15 between stripes is exposed twice by the electron beam with respective scan doses that are less than the target scan dose. The non-overlapping or central portion of each stripe is exposed once with the target scan dose. The overlap of the electron beam in the overlap region 15 of FIG. 3 functions to prevent butting errors.

Since overlapped or multi-pass exposure is performed only in the overlap region 15 of FIG. 3, the first embodiment differs from the conventional multi-pass printing method in which the overlap exposure is performed over the entirety of each stripe region. Since the overlap exposure is performed over the whole stripe region in the conventional multi-pass printing method, the time necessary for the whole exposure process increases greatly, and thus the throughout loss is also increased. However, the overlap exposure according to the first embodiment of the present invention is performed only in the overlap region 15 of FIG. 3, and such region is only a small part of the whole stripe region, for example, about ¹⁄₁₀ of the whole stripe region. Therefore, the increase in time necessary for the whole exposure using the overlap exposure can be minimized, and also the throughout loss can be minimized.

In the first embodiment of the present invention, there is performed an electron beam exposure with only one pass, i.e., setting the stripe having an overlap region by extending the stripe. In addition, if the stripe is set to have the extended region by employing the multi-pass printing method and the electron beam exposure is repeated, the occurrence of butting errors at the boundaries between the stripes can be even more effectively compensated or prevented.

Figure 6:
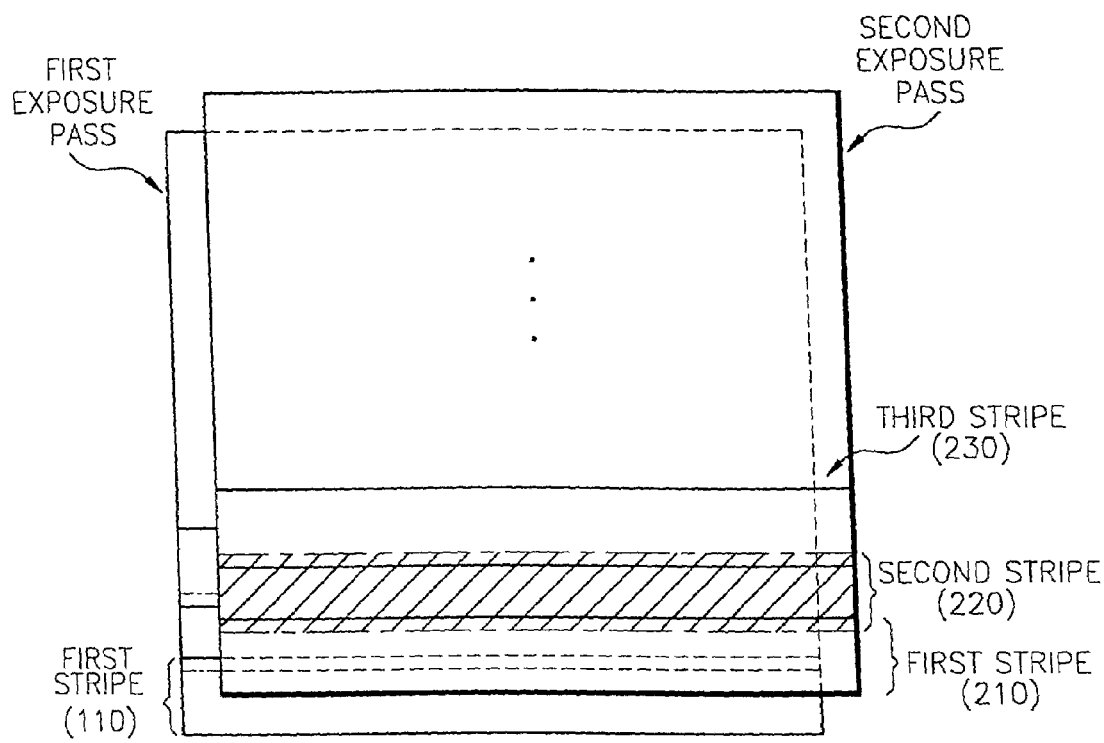
FIG. 6 is a schematic diagram for explaining a method of performing electron beam lithography according to a second embodiment of the present invention.

FIG. 6 is a schematic diagram for explaining an electron beam lithography method according to a second embodiment of the present invention. Referring to FIG. 6, the first stripe 110 is set to be extended to have the overlap region 15 with reference to the second stripe. The other stripes are also set to have respective overlap regions. After that, a first exposure pass is performed.

Next, a first stripe 210 for a second exposure as shown in FIG. 6 is set to be moved by a half of the width of the first stripe 110 of the first exposure pass, and then a second stripe 220 and a third stripe 230 are set likewise. Such setting of the stripes for the second exposure moves the overlap regions between the stripes. Then, the second exposure is sequentially performed from the first stripe 210 to the second stripe 220 and the third stripe 230.

Here, the dose for the exposure in the first exposure or the second exposure is half of the target dose, and thus the target dose can be achieved after completion of the first exposure and the second exposure. In addition, it is preferable that the scan dose of the electron beam in the overlap region is smaller than the first exposure (or the second exposure), as in the first embodiment of the present invention.

As described above, inferiority such as butting errors can be effectively reduced by applying the extended stripe according to the first embodiment of the present invention to the multi-pass printing method. In addition to preventing errors, the exposure time can be greatly reduced because the overlap exposure is performed only in the overlap region 15 at the boundaries between stripes, as shown in FIG. 3.

In the second embodiment of the present invention as described with reference to FIG. 6, two exposure passes are performed. However, the second embodiment of the present invention can be performed using more than two exposure passes.

According to the present invention, inferiority such as butting errors can be minimized and an increase in the time necessary for the electron beam exposure due to the overlap exposure also can be minimized. Therefore, in mask fabricating, throughput loss due to increase in time necessary for electron beam exposure can be minimized.

While this invention has been particularly shown and described with reference to preferred embodiments thereof, it will be understood by those skilled in the art that various changes in form and details may be made therein without departing from the spirit and scope of the invention as defined by the appended claims and equivalents.

What is claimed is:

1. An electron beam lithography method comprising:
   extending widths of a plurality of stripes which divide a region where an electron beam exposure is to be performed, so that the stripes overlap adjacent stripes at boundaries between the stripes, wherein the scan dose of the electron beam for the extended region of a stripe is less than the scan dose of the electron beam for a non-extended region of the stripe, and wherein the scan dose of the electron beam for the extended region of a stripe is reduced in a stepwise manner toward an adjacent stripe and has at least two intermediate steps between the electron beam for a non-extended region of the stripe and a zero scan dose; and
   sequentially performing electron beam exposure for each of the stripes.

2. The electron beam lithography method of claim 1, wherein the scan dose of the electron beam for the extended region of a stripe has at least three intermediate steps between the electron beam dose for a non-extended region of the stripe and zero scan dose.

3. The electron beam lithography method of claim 2, wherein the scan dose of the electron beam for at least one intermediate step for the extended region of a stripe is half the scan dose of the electron beam for the non-extended region of the stripe.

4. The electron beam lithography method of claim 2, further comprising performing a second electron beam lithography step that includes extending widths of a plurality of stripes which divide a region where an electron beam exposure is to be performed, so that the stripes overlap adjacent stripes at boundaries between the stripes.

5. An electron beam lithography method comprising:
performing a first electron beam exposure by extending a width of a first stripe of a plurality of stripes which divide a region where an electron beam exposure is to be performed, so that the stripes overlap adjacent stripes at boundaries between the stripes, and wherein the scan dose of the electron beam for the extended region of a stripe is reduced in a stepwise manner toward an adjacent stripe;
sequentially performing a second electron beam exposure by extending the width of a second stripe of a plurality of second stripes which divide the region where the electron beam exposure is to be performed, wherein the extended regions of the first and second beam exposures are staggered with respect to one another such that the extended region of the first exposure falls within the non-extended region of the second exposure.

6. The electron beam lithography method of claim 5, wherein the scan dose of the electron beam for the extended region of a stripe has at least two intermediate steps between the electron beam for a non-extended region of the stripe and zero scan dose.

7. The electron beam lithography method of claim 5, wherein a scan dose of the electron beam for at least one intermediate step for the extended region of a stripe is half the scan dose of the electron beam for the non-extended region of the stripe.

8. The method of claim 6, wherein the first and second electron beam exposures are performed at half a target dose.

9. An electron beam lithography method comprising:
sequentially performing a first electron beam exposure on each stripe of a plurality of stripes which divide a region where an electron beam exposure is to be performed, wherein each stripe has an extended width so that each stripe overlaps adjacent stripes at boundaries between each of the stripes, and wherein the scan dose of the electron beam for the extended region of a stripe is reduced in a stepwise manner toward an adjacent stripe;
moving overlap regions of the stripes by moving the stripes; and
sequentially performing a second electron beam exposure for each of the moved stripes in a manner such that such that extended regions of the first exposure fall within the non-extended regions of the second exposure.

10. The electron beam lithography method of claim 9, wherein the scan dose of the electron beam for the extended region of a stripe has at least three intermediate steps between the electron beam for a non-extended region of the stripe and zero scan dose.

11. The electron beam lithography method of claim 10, wherein the scan dose of the electron beam for at least one intermediate step for the extended region of a stripe is half the scan dose of the electron beam for the non-extended region of the stripe.

12. The electron beam lithography method of claim 10, wherein the scan dose of the electron beam for the extended region of a stripe has at least two intermediate steps between the electron beam for a non-extended region of the stripe and zero scan dose.

13. The electron beam lithography method of claim 9, wherein the first and second electron beam exposures are performed at half a target dose.

* * * * *